US007435689B2

(12) United States Patent
Teramoto

(10) Patent No.: US 7,435,689 B2
(45) Date of Patent: Oct. 14, 2008

(54) PROCESS FOR FABRICATING ELECTRON EMITTING DEVICE, ELECTRON SOURCE, AND IMAGE DISPLAY DEVICE

(75) Inventor: Yoji Teramoto, Kanagawa-Ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 145 days.

(21) Appl. No.: 11/467,356

(22) Filed: Aug. 25, 2006

(65) Prior Publication Data

US 2007/0054585 A1 Mar. 8, 2007

(30) Foreign Application Priority Data

Sep. 5, 2005 (JP) ............................. 2005-255835

(51) Int. Cl.
*H01L 21/302* (2006.01)

(52) U.S. Cl. ......................... 438/750; 438/20; 438/706; 438/745

(58) Field of Classification Search ................... 438/20, 438/706, 745, 750
See application file for complete search history.

(56) References Cited

U.S. PATENT DOCUMENTS

| | | | | |
|---|---|---|---|---|
| 6,991,949 | B2 * | 1/2006 | Muroyama et al. | 438/20 |
| 7,074,102 | B2 | 7/2006 | Teramoto | 445/24 |
| 7,109,663 | B2 | 9/2006 | Fujiwara et al. | 315/169.4 |
| 2003/0067259 | A1 * | 4/2003 | Nishimura | 313/310 |
| 2006/0061289 | A1 | 3/2006 | Fujiwara et al. | 315/169.1 |
| 2006/0125370 | A1 | 6/2006 | Nishimura et al. | 313/310 |

FOREIGN PATENT DOCUMENTS

| | | |
|---|---|---|
| JP | 8-96704 | 4/1996 |
| JP | 8-264109 | 10/1996 |
| JP | 2000-195448 | 7/2000 |

* cited by examiner

*Primary Examiner*—Lan Vinh
(74) *Attorney, Agent, or Firm*—Fitzpatrick, Cella, Harper & Scinto

(57) ABSTRACT

A process for fabricating an electron emitting device comprises a cathode electrode and a gate electrode are laminated through an insulating layer and an electron emitting film on the cathode electrode located in a gate hole penetrating through the gate electrode and the insulating layer. Wherein, a second hole penetrating through at least the gate electrode between the insulating layer and the gate electrode is juxtaposed with a first hole as a gate hole is formed, and the insulating layer between the second hole and the first hole in which the electron emitting film is deposited to the inner wall surface is etched until the first hole and the second hole are communicated with each other. Thereby, electron emitting film material is removed form the hole to reduce a leakage current.

7 Claims, 8 Drawing Sheets

PROCESS FOR FABRICATING ELECTRON EMITTING DEVICE, ELECTRON SOURCE, AND IMAGE DISPLAY DEVICE

BACKGROUND OF THE INVENTION

1. Field of the Invention

The present invention relates to a process for fabricating an electron emitting device, an electron source, and an image display device.

2. Description of the Related Art

As electron emitting devices, there are an electric field emission type (hereinafter, referred to as an "FE type") and the like. As an FE type, there is a structure in which a cathode electrode and a gate electrode are laminated through an insulating layer and an electron emitting member is arranged on the cathode electrode locating in a hole (gate hole) which penetrates the gate electrode and the insulating layer. As a typical example of such a structure, there is a spindt type in which a conical electron emitting member is arranged in the hole.

Hitherto, the following processes have been known as processes for fabricating the electron emitting devices.

(1) A method whereby, after a hole is formed, the electron emitting member is deposited into the hole by a lift-off process (refer to Japanese Laid-open Patent Publication No. H8-96704).

(2) A method whereby, after the electron emitting member was deposited into a hole, an etchant is introduced into the hole and a part of an electron emitting film deposited onto a hole inner sidewall surface of an insulating film (refer to Japanese Laid-open Patent Publication No. 2000-195448).

(3) A method whereby, after the electron emitting member was previously deposited onto a cathode electrode, an insulating layer and a gate electrode are formed and, subsequently, a hole is formed (refer to Japanese Laid-open Patent Publication No. H8-264109).

SUMMARY OF THE INVENTION

However, in the case of using the lift-off process for the deposition of the electron emitting member as disclosed in Japanese Laid-open Patent Publication No. H8-96704, when the electron emitting member is deposited into the hole (when the electron emitting member is deposited onto the inner surface of the hole), an deposition of the electron emitting member as an electroconductive material is liable to occur in a sidewall portion of the insulating layer in the hole. Also at the time of the lift-off, a deposition of the electron emitting member is liable to occur in a sidewall portion of the insulating layer in the hole. Therefore, there is a tendency of increase in a leak current between the gate electrode and the cathode electrode.

In Japanese Laid-open Patent Publication No. H8-96704, there has also been disclosed a technique in which after the hole is formed, an overhang portion is formed by removing a part of the insulating layer exposed in the hole by wet etching or the like. According to such a technique, it is intended to eliminate the deposition of the electron emitting member to the sidewall portion of the insulating layer in the hole by using the hole formed with the overhang portion as a mask. However, if such a technique is used, a film forming method of the electron emitting member is limited to a film forming method with high directivity and a problem of a decrease in process margin occurs.

Even if the etchant is introduced into the hole where the electron emitting member has been deposited therein, an extraneous matter (a part of the electron emitting member) itself becomes a barrier and a sufficient etching process cannot be performed although it depends on an area of the deposited electron emitting member or its deposition amount. That is, there is a case where the etchant does not enter between the extraneous matter (a part of the electron emitting member) and the sidewall of the insulating layer and the extraneous matter cannot be sufficiently removed and a leak current between the gate electrode and the cathode electrode cannot be eliminated. Since structures of the deposition differ every hole, a variation in the leak current also occurs.

According to the method of Japanese Laid-open Patent Publication No. H8-264109, the foregoing problem of the leak current due to the extraneous matter can be solved. However, according to such a method, in the process for forming the hole, the electron emitting member becomes a stop layer. Therefore, it is necessary that the electron emitting member has an etching rate which is sufficiently slow for the etching. This results in a decrease in process margins of selection of materials of the insulating layer and the electron emitting member, selection of an etching process, and the like. Further, since the electron emitting member is exposed to the etching process for a long time, deterioration of the electron emitting member is caused by a plasma or the like. Further, if the device is fabricated by such a method, it is difficult to avoid a part of the electron emitting film from existing just under the gate electrode. Therefore, an electron emitted from the portion of the electron emitting member just under the gate electrode is directly irradiated to the gate electrode just above the electron emitting member. Consequently, a reactive current of the electron emitting device fabricated by such a method increases.

The invention is made to solve the problems in the related arts as mentioned above and it is an object of the invention to provide an electron emitting device of an electric field emission type of high efficiency in which a leak current is small, an electron source, and their fabricating process which can easily obtain an image display device.

According to the present invention, there is provided a process for fabricating an electron emitting device. The process comprises the steps:

(A) providing a structure which comprises a first conductive layer, an insulating layer disposed on the first conductive layer and a second conductive layer disposed on the insulating layer wherein a first hole (6) penetrates to the first conductive layer through the insulating layer and the second conductive layer;

(B) depositing a layer of material for an electron emitting member, onto the inner surface of the first hole;

(C) forming a second hole which penetrates through at least the second conductive layer amongst the insulating layer and the second conductive layer, the second hole being juxtaposed with the first hole; and (D) etching a part of the insulating layer interposed between the juxtaposed first and second holes until the first and second holes are communicated with each other.

In an embodiment, the layer of material from which an electron emitting member is deposited by a spraying process.

In an embodiment, the etching in the step (D) is a wet etching.

According to the present invention, there is provided a process of producing an electron source provided with a plurality of electron emitting devices, each of which is fabricated by the above process.

According to the present invention, there is provided a process of assembling an image display device provided with an electron source and a light-emitting member which emits light when being irradiated by electrons emitted from the electron source, wherein the electron source is produced by the above process.

According to another aspect of the invention, there is provided a process for fabricating an electron emitting device. The process comprises the steps:

(A) providing a structure which comprises a first conductive layer (2), an insulating layer (3) disposed on the first conductive layer and a second conductive layer (4) disposed on said insulating layer, wherein a first hole (6) penetrates to the first conductive layer through the insulating layer and the second conductive layer and a second hole (7) juxtaposed with the first hole penetrates through at least the insulating layer, and a layer of material for an electron emitting member is deposited on the inner surface of the first hole; and (B) etching a pair of the insulating layer interposed between the juxtaposed first and second holes, until the layer of electron emitting member material deposited on the inner sidewall of the first hole collapses so that the juxtaposed first and second holes are communicated with each other.

According to the present invention, there is provided a process of fabricating an image display device provided with a plurality of electron emitting devices, each of which is fabricated by the above process.

According to the invention, the electron emitting member deposited onto the inner sidewall of the first hole at the time of the deposition of the electron emitting member can be removed together with the removal of the inner sidewall of the first hole. Therefore, the display of low electric power consumption can be manufactured with a high yield owing to the decrease in the leak current and the decrease in the luminance variation in the display screen due to the increase in the process margin.

Further features of the present invention will become apparent from the following description of exemplary embodiments (with reference to the attached drawings).

BRIEF DESCRIPTION OF THE DRAWINGS

FIGS. 4A and 4B are diagrams showing another example of the first hole and the second hole, in which FIG. 4A is a plan view and FIG. 4B is a cross sectional view after an etching process when seen from the second hole side.

FIGS. 6A and 6B are diagrams showing another example of an insulating layer, in which FIG. 6A is a cross sectional view before the first hole and the second hole are formed and FIG. 6B is a cross sectional view after the etching process when seen from the second hole side.

FIGS. 7A and 7B are diagrams showing another example of a forming step of an electron emitting film, in which FIG. 7A is a cross sectional view before the etching process when seen from the second hole side and FIG. 7B is a cross sectional view after the etching process when seen from the second hole side.

DESCRIPTION OF THE EMBODIMENTS

Preferred embodiments of the invention will be specifically explained in detail hereinbelow with reference to the drawings.

FIGS. 1A to 1D and 2A to 2D are diagrams showing an example of a flow for a process for fabricating an electron emitting device according to the invention. Each processing step of FIGS. 1A to 1D and 2A to 2D will be described hereinbelow.

Figure 1A:
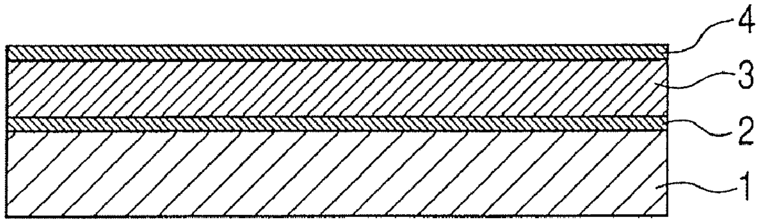
FIGS. 1A, 1B, 1C and 1D are explanatory diagrams sequentially showing an example of a procedure for a process for fabricating an electron emitting device according to the invention.

(1) Step of FIG. 1A

First, a first conductive layer 2 (finally, called a "cathode electrode") of the invention is laminated (stacked) onto a substrate 1. As a substrate 1, any one of the following plates can be used: quartz glass whose surface has previously been sufficiently cleaned; glass in which a content of impurities of Na or the like is reduced; soda lime glass; a laminate obtained by laminating $SiO_2$ onto a silicon plate or the like by a sputtering method or the like; an insulating substrate of ceramics of alumina or the like; and the like.

The first conductive layer 2 (cathode electrode) generally has electroconductivity and is formed by a general vacuum film forming technique such as evaporation depositing method, sputtering method, or the like or by a photolithography technique. As a constructing material of the cathode electrode 2, for example, any one of the following materials can be used: a metal or an alloy material of Be, Mg, Ti, Zr, Hf, V, Nb, Ta, Mo, W, Al, Cu, Ni, Cr, Au, Pt, Pd, or the like; a carbide such as TiC, ZrC, HfC, TaC, SiC, WC, or the like; a boride such as $HfB_2$, $ZrB_2$, $LaB_6$, $CeB_6$, $YB_4$, $GdB_4$, or the like; a nitride such as TiN, ZrN, HfN, or the like; a semiconductor of Si, Ge, or the like; and the like. A thickness of cathode electrode 2 is ordinarily set to a value within a range from 10 nm to 100 μm, preferably, a thickness within a range from 100 nm to 10 μm is selected.

Subsequently, an insulating layer 3 is deposited. The insulating layer 3 is formed by the general vacuum film forming method such as a sputtering method or the like, a CVD method, or a vacuum evaporation depositing method. A thickness of insulating layer 3 is ordinarily set to a value within a range from 10 nm to 100 μm, preferably, a thickness within a range from 10 nm to 5 μm is selected. As a constructing material of the insulating layer 3, it is preferable to use a material with a high withstanding voltage which can endure a high electric field such as silicon oxide (typically, $SiO_2$), SiN, aluminum oxide ($Al_2O_3$), CaF, undoped diamond, or the like. As a constructing material of the insulating layer 3, it is preferable to use a material which can be more easily etched than a constructing material of an electron emitting film 5 which is formed in step 6, which will be explained hereinafter, by an etching in step 8, which will be explained hereinafter.

Further, subsequent to the insulating layer 3, a second conductive layer 4 (finally functions as a gate electrode) is deposited. The second conductive layer 4 (gate electrode) has electroconductivity in a manner similar to the first conductive layer 2 (cathode electrode) and can be formed by the general vacuum film forming technique such as evaporation depositing method, sputtering method, or the like or by the photolithography technique. As a constructing material of the second conductive layer 4 (gate electrode), for example, any one of the following materials can be used: a metal or an alloy material of Be, Mg, Ti, Zr, Hf, V, Nb, Ta, Mo, W, Al, Cu, Ni, Cr, Au, Pt, Pd, or the like; a carbide such as TiC, ZrC, HfC, TaC, SiC, WC, or the like; a boride such as $HfB_2$, $ZrB_2$, $LaB_6$, $CeB_6$, $YB_4$, $GdB_4$, or the like; a nitride such as TiN, ZrN, HfN, or the like; a semiconductor of Si, Ge, or the like; and the like. A thickness of gate electrode 4 is ordinarily set to a value within a range from 1 nm to 100 μm, preferably, a thickness within a range from 10 nm to 1 μm is selected.

The first conductive layer (cathode electrode) 2 and the second conductive layer (gate electrode) 4 may be formed by the same material or different materials or may be formed by the same forming method or different methods.

Figure 1B:
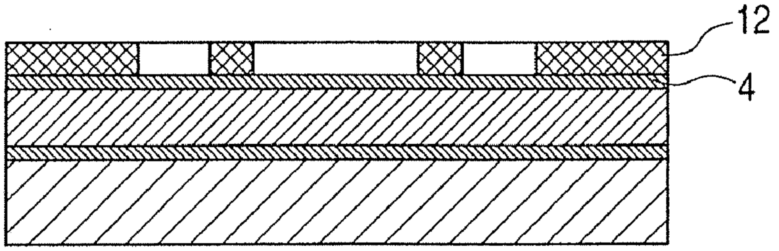

(2) Step of FIG. 1B

A mask 12 of a desired pattern is formed onto the second conductive layer (gate electrode) 4 by using the photolithography technique or the like. As a material of the mask 12, a well-known resist material can be used. As a pattern (hole) of the mask 12, a proper pattern is selected in accordance with shapes of a first hole 6 and a second hole 7 which are formed in step 3.

Figure 1C:
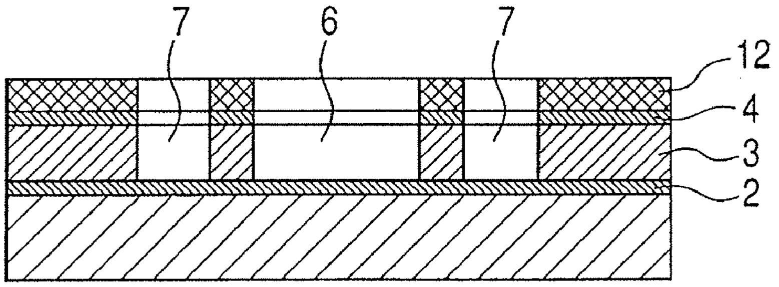

(3) Step of FIG. 1C

The first hole 6 and the second hole 7 (which is juxtaposed therewith) which penetrate through the second conductive layer (gate electrode) 4 and the insulating layer 3 which are not covered with the mask 12 and reach the first conductive layer (cathode electrode) 2 are formed by the etching such as dry etching or the like. The shape of each of the first hole 6 and the second hole 7 is similar to that of a hole of the mask 12. Forming order of the first hole 6 and the second hole 7 is not limited, that is, any of the first and second holes 6 and 7 may be formed first or they may be simultaneously formed. The second hole 7 may be formed at timing between the following steps 5 and 6.

Figure 3:
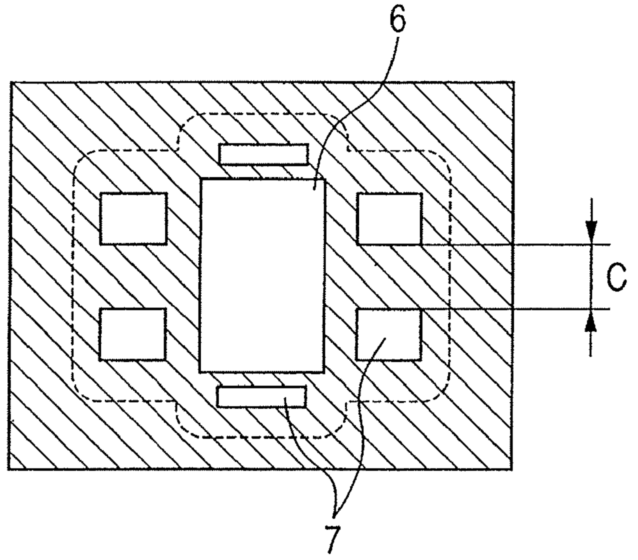
FIG. 3 is a plan view showing an example of a first hole and second holes.
Figure 4A:
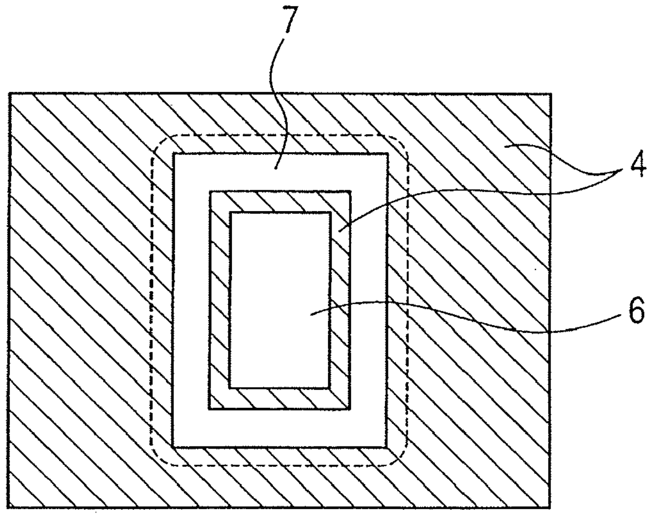

As a second hole 7, as shown in FIG. 3, it is possible to form gaps at positions surrounding the first hole 6 and form a plurality of second holes, or as shown in FIG. 4A, it is possible to form a second hole in an annular shape which continuously surrounds the first hole 6.

Figure 5:
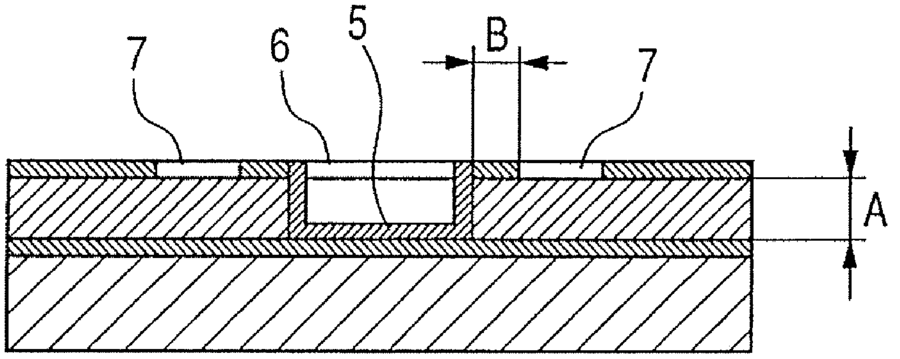
FIG. 5 is a cross sectional view showing another example of the second hole.

FIGS. 1A to 1D show the form in which both of the first hole 6 and the second hole 7 penetrate through the second conductive layer (gate electrode) 4 and the insulating layer 3. However, as shown in FIG. 5, it is sufficient that the second hole 7 penetrates through at least the second conductive layer (gate electrode) 4 so that the etching of the insulating layer 3 which is executed in step 8, which will be explained hereinafter, can be executed.

Figure 1D:
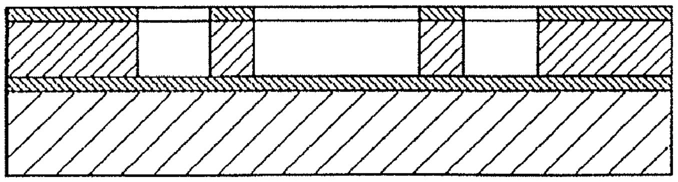

(4) Step of FIG. 1D

The mask 12 is removed.

Figure 2A:
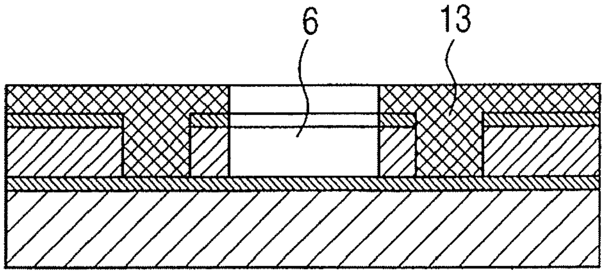
FIGS. 2A, 2B, 2C and 2D are explanatory diagrams sequentially showing the example of the procedure for the process for fabricating the electron emitting device according to the invention and are sequel to FIGS. 1A to 1D.

(5) Step of FIG. 2A

A mask 13 having a hole communicated with the first hole 6 is formed so as to form the electron emitting film 5 only in the first hole 6. The mask 13 can be formed by using the photolithography technique or the like.

Figure 2B:
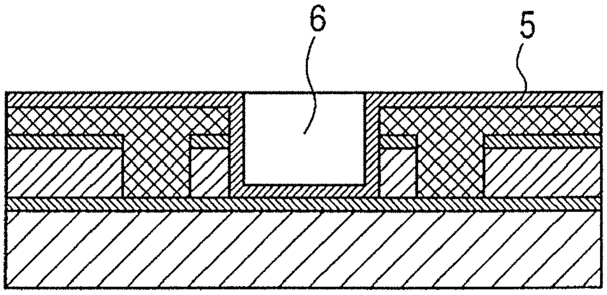

(6) Step of FIG. 2B

Subsequently, the electron emitting film 5 is formed in the first hole 6. As shown in FIGS. 1A to 1D, the electron emitting film 5 can be formed by the lift-off technique. If an ink-jet technique is used, a constructing material of the electron emitting film 5 can be also selectively deposited into the first hole 6, the mask 13 is not always necessary. As a material constructing the electron emitting film 5, for example, it is possible to properly select any one of graphite, Fullerene, carbon nanotube, diamond-like carbon, carbon in which diamond has been dispersed, carbon compound, and the like. It is preferable to use a carbon film (such as a diamond film, diamond-like carbon, amorphous carbon film). A thickness of electron emitting film 5 is ordinarily set to a value within a range from 1 nm to 5 μm, preferably, a thickness within a range from 5 nm to 100 nm is selected.

Figure 2C:
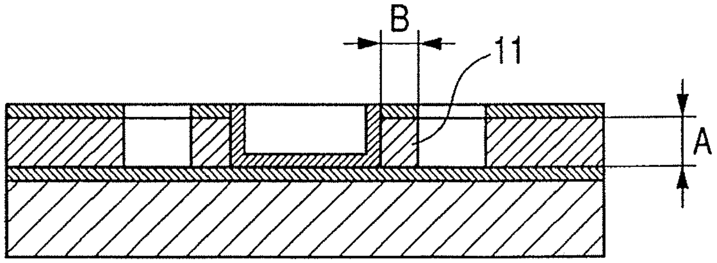

(7) Step of FIG. 2C

The mask 13 is removed.

Figure 2D:
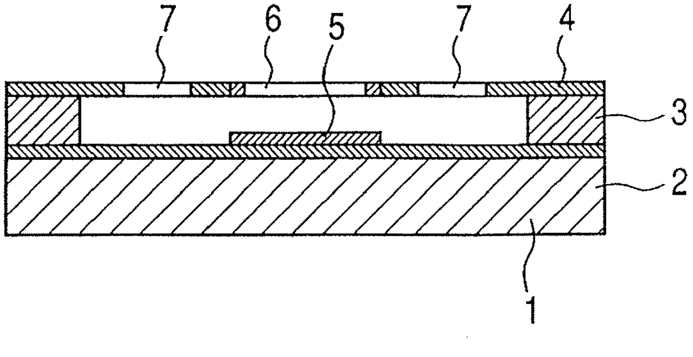

(8) Step of FIG. 2D

Subsequently, the etching of the insulating layer 3 is executed. Upon etching, it is desirable to use an etching method in which the directivity is small. Specifically speaking, an isotropic etching is preferable and, particularly, a wet etching is preferable. As an isotropic etching method, it is not limited only to the wet etching but a dry etching using a radical as main etching species like a chemical dry etching can be used.

As a solution (etchant) which is used for the wet etching, it is desirable to use an etchant by which the insulating layer 3 can be etched and the cathode electrode 2, gate electrode 4, and electron emitting film 5 are not substantially etched nor deteriorated. As an etching rate of the solution which is used for the wet etching to the cathode electrode 2 and the gate electrode 4, 1/20 or less is desirable and 1/100 is more preferable. As an etching rate of the solution to the electron emitting film 5, 1/50 is desirable and 1/200 is more preferable. The etching solution which is used at this time is used in a temperature range of 4 to 100° C., preferably, 20 to 50° C. In the etching step, a part or all of a wall 11 of the insulating layer between the second hole 7 and the first hole 6 (refer to FIG. 2C) is etched and removed from the first hole 6 side until at least the first hole 6 and the second hole 7 are communicated with each other.

An electric leakage between the cathode electrode 2 and the gate electrode 4 occurs by the material, as a main cause, constructing the electron emitting film 5 deposited to the inner sidewall of the first hole 6. Therefore, by removing such a material, the leak current can be remarkably reduced. An amount of current to be reduced is proportional to an amount obtained by removing the material constructing the electron emitting film 5 deposited onto the inner sidewall of the first hole 6. Therefore, by removing a part or all of the inner sidewall of the first hole 6 and changing the pattern (hole shape), the leak current can be controlled.

The hole shape of the second hole 7 can be specified mainly by the shape and size of the hole 6 and the thickness of insulating layer 3. In the case where the wet etching process has been executed, the amount of leak current can be reduced by 80% or more as compared with that in the case where the wet etching process is not executed.

The shape of the second hole 7 may be formed into an arbitrary shape. It is possible to select from, for example, a straight slit, a bent slit, a rectangular hole, a circular hole, concentrical slits, a rectangular annular slit, and the like. In the case of using the wet etching, it is sufficient to set the second hole 7 to a size enough to enable the etchant to be sufficiently inserted. For example, each of a width in the case of forming the hole 7 into the rectangular shape and a diameter in the case of forming the hole 7 into the circular shape lies within a range of 0.5 to 1000 μm, preferably, a range of 1 to 10 μm.

As shown in FIG. 3, if there is a variation in sizes of a plurality of second holes 7, as for a distance of closest approach B (refer to FIG. 2C) between the first hole 6 and the second hole 7, it is preferable to set the distance of closest approach B with respect to the small second hole 7 to be smaller with respect to the large second hole 7. If the sizes of all of the second holes 7 are the same, it is desirable that the distance of closest approach B is substantially constant. Etching conditions can be substantially determined on the basis of a thickness A of insulating layer 3 (refer to FIG. 2C), an etching rate R as a speed when the insulating layer 3 is etched, and an etching time t. As shown in FIG. 2C, if the second hole 7 penetrates through the second conductive layer (gate electrode) 4 and the insulating layer 3 in a manner similar to the first hole 6, in order to remove the insulating layer 3 existing between the first hole 6 and the second hole 7, it is preferable to execute the etching under conditions of ($B \leqq R \times t$). As shown in FIG. 5, if the second hole 7 penetrates through only the second conductive layer (gate electrode) 4, in order to remove the wall 11 of the insulating layer 3 existing between the first hole 6 and the second hole 7, it is preferable to execute the etching under conditions of $[(A2+B2)^{1/2} \leqq R \times t]$.

Figure 4B:
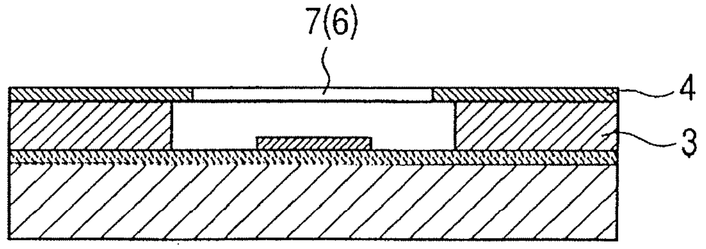

As shown in FIG. 3, if two or more second holes 7 are provided for one first hole 6, a distance of closest approach C between the second hole 7 and another second hole 7 juxtaposed therewith can be also set to be larger than the distance of closest approach B between the first hole 6 and the second hole 7. However, it is desirable to set the distance of closest approach C to be smaller than the distance of closest approach B. By setting as mentioned above, the whole insulating layer 3 in a region surrounded by a broken line in FIG. 3 can be easily removed. The inner sidewall of the first hole 6 of the whole circumference can be continuously removed. In such a case, since the gate electrode 4 around the first hole 6 is continuous with respect to the second holes 7, it is left in the state where it is projected in an eaved shape as shown in FIG. 2D. In the case where the second hole 7 is formed in an annular shape surrounding the first hole 6 as shown in FIG. 4A, the whole insulating layer 3 in a region surrounded by a broken line in FIG. 4A can be easily removed. The inner sidewall of the first hole 6 of the whole circumference can be continuously easily removed. In such a case, as shown in FIG. 4B, the gate electrode 4 between the first hole 6 and the second hole 7 is removed together with the removal of the inner sidewall of the first hole 6.

Figure 6A:
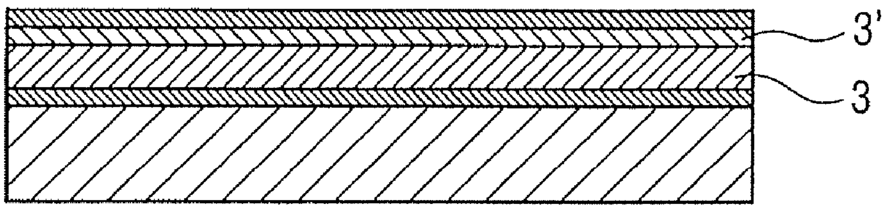
Figure 6B:
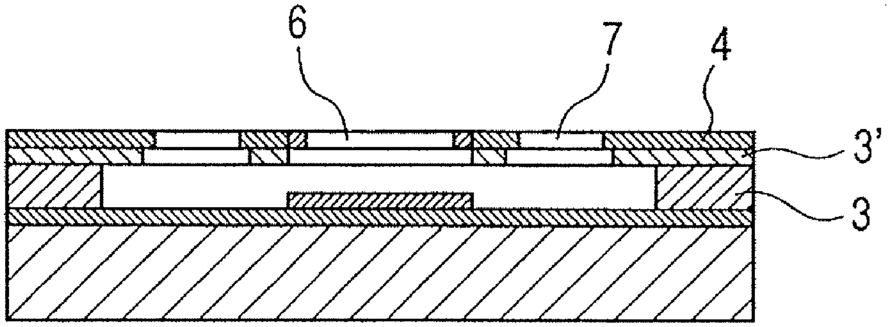

FIGS. 6A and 6B are diagrams showing another example in the case of forming the insulating layer 3. Although one layer has been formed as an insulating layer 3 in FIG. 1A, as shown in FIG. 6A, another insulating layer 3' which is difficult to be etched more than the insulating layer 3 can be formed on the insulating layer 3. By using such a structure, as shown in FIG. 6B, after the etching, since the insulating layer 3' is left under the second conductive layer (gate electrode) 4 which is left between the first hole 6 and the second hole 7, portion of the second conductive layer (gate electrode) 4 around the first hole 6 projected in the eaved shape can be reinforced.

Figure 7A:
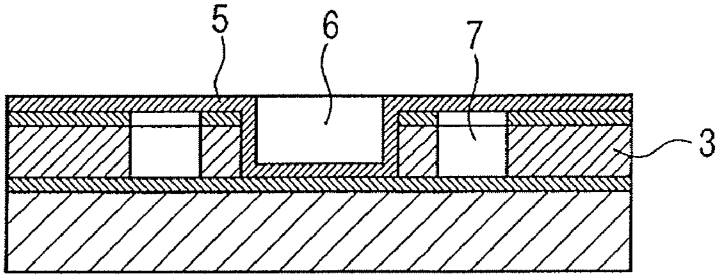
Figure 7B:
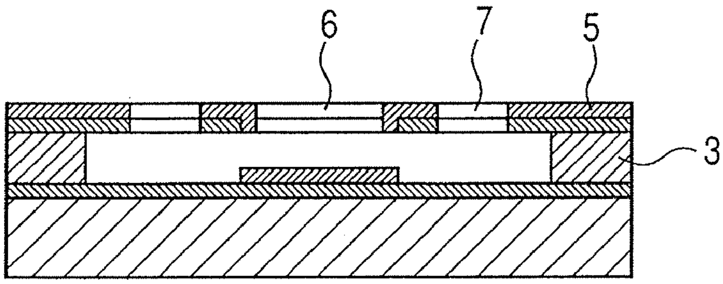

FIGS. 7A and 7B are diagrams showing another example in the case of forming the electron emitting film 5. As shown in FIG. 7A, the first hole 6 is set to a size in which the material forming the electron emitting film 5 can be easily inserted, the second hole 7 is set to a size in which the material forming the electron emitting film 5 cannot be inserted, and the material forming the electron emitting film 5 is formed on those holes by, for example, a coating method, so that the electron emitting film 5 can be formed. In this case, although there is also a case where the second hole 7 enters the state where it is coated with the electron emitting film 5, since the lower side of the electron emitting film 5 on the second hole 7 is not supported, it can be easily removed upon etching by an ultrasonic vibration or the like. Therefore, if the electron emitting film 5 on the second hole 7 is removed and the insulating layer 3 is etching-removed from the second hole 7, as shown in FIG. 7B, the state where the insulating layer 3 between the first hole 6 and the second hole 7 has been removed is obtained.

Figure 8:
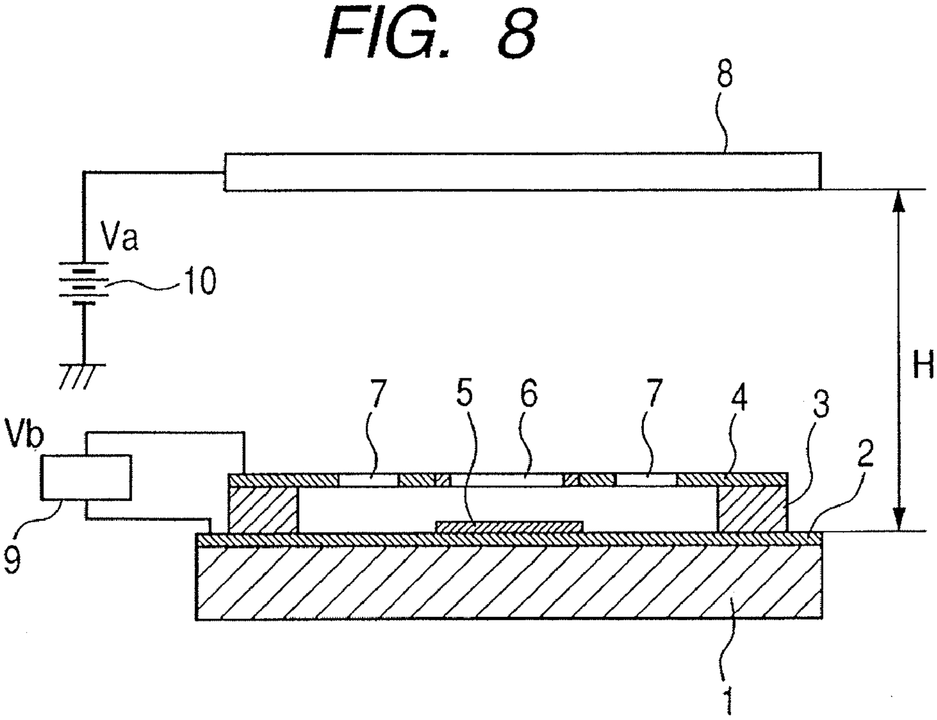
FIG. 8 is an explanatory diagram when the electron emitting device obtained by the process of the invention is driven.

According to the electron emitting device obtained by the process of the invention described in FIGS. 1A to 1D and 2A to 2D, for example, as shown in FIG. 8, an anode electrode 8 to which a high voltage power source 10 has been connected is arranged so as to face the device and by applying a voltage between the cathode electrode 2 and the gate electrode 4 from a power source 9 for driving, an electron can be emitted from the electron emitting film 5. In FIG. 8, reference numeral 1 denotes the substrate; 2 the cathode electrode; 3 the insulating layer; 4 the gate electrode; 5 the electron emitting film; 6 the first hole; and 7 the second hole juxtaposed with the first hole 6. Vb denotes a voltage which is applied between the gate electrode 4 and the cathode electrode 2 and Va indicates a voltage which is applied between the gate electrode 4 and the anode electrode 8.

Although the embodiment has been described above with respect to an example in which the electron emitting film 5 is used as an electron emitting member, the electron emitting member of the invention is not limited only to the film-shaped member but a conical electron emitting member or the like of what is called a spindt type can be also applied. The invention can be preferably applied to the process for fabricating the electron emitting device having the step of depositing the electron emitting member into the hole after the hole (gate hole) which penetrates through the insulating layer 3 arranged between the cathode electrode 2 and the gate electrode 4 and the gate electrode 4 was formed. Although the structure in which the electron emitting film 5 has directly been arranged on the cathode electrode 2 has been shown here, a resistance film may be also arranged between the cathode electrode 2 and the electron emitting film 5 for the purpose of limiting the current or the like. The electrode having such a resistance film is also incorporated in the cathode electrode 2.

An application example in which the electron emitting device formed by the fabricating process of the invention has been applied will be described hereinbelow.

By arranging a plurality of electron emitting devices of the invention onto the substrate, for example, an electron source or an image display device can be realized.

Figure 9:
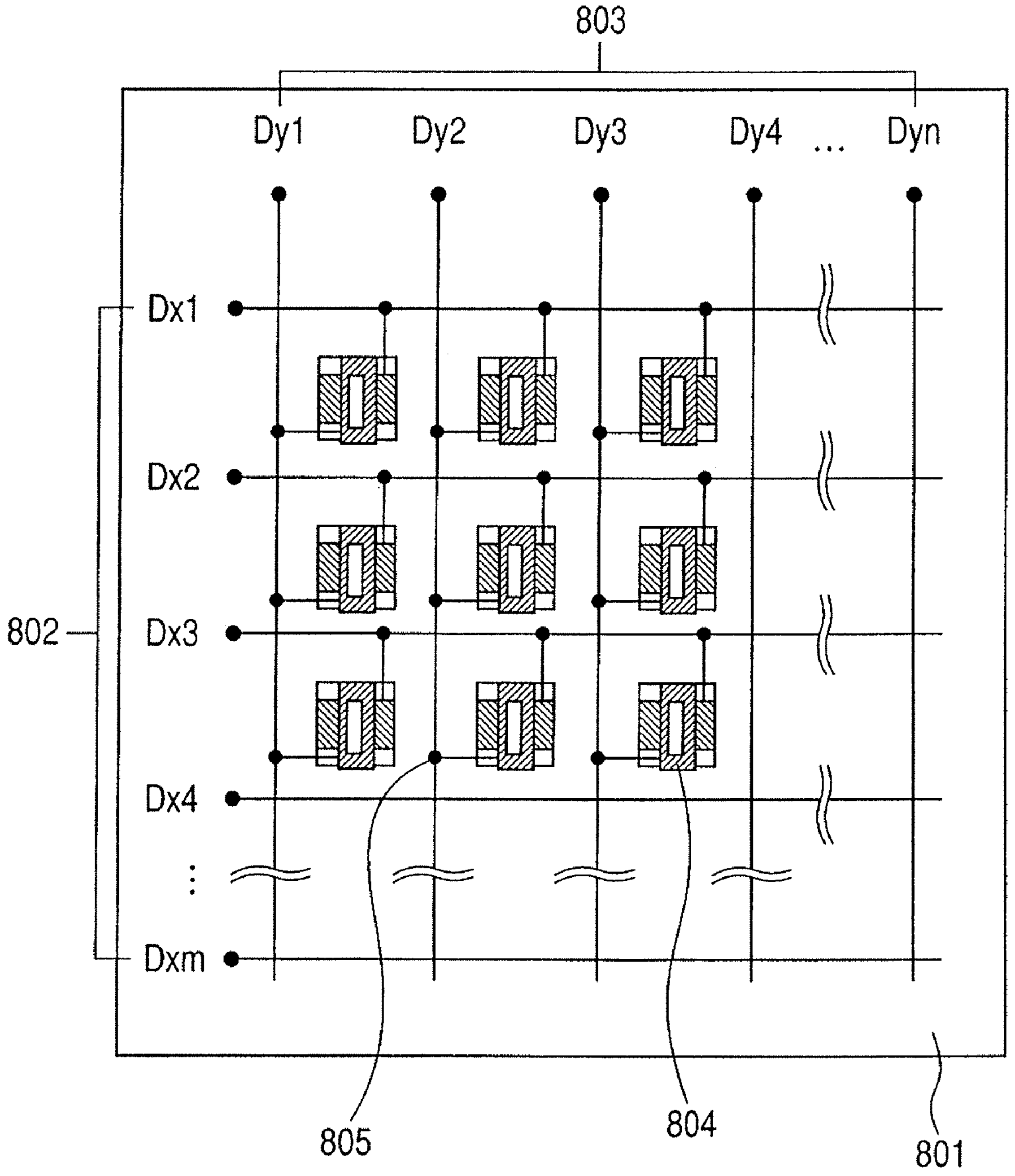
FIG. 9 is a schematic constructional diagram showing an electron source of the matrix arrangement obtained by the process of the invention.

FIG. 9 is a schematic diagram of the electron source obtained by arranging a plurality of electron emitting devices of the invention. In FIG. 9, (m) X-directional wirings 802, (n) Y-directional wirings 803, and a number of (m×n) electron emitting devices 804 are arranged on an electron source substrate 801. Each electron emitting devices 804 is connected to one of the X-directional wirings 802 and one of the Y-directional wirings 803. The connection between the wirings 802 and 803 and the electron emitting devices 804 is made through the cathode electrode and the gate electrode.

The X-directional wirings 802 are constructed by the (m) wirings Dx1, Dx2, . . . , and Dxm and can be made of an electroconductive material formed by using the vacuum evaporation depositing method, printing method, sputtering method, or the like. A material, a film thickness, and a width of each wiring are properly designed. The Y-directional wirings 803 are constructed by the (n) wirings Dy1, Dy2, . . . , and Dyn and are formed in a manner similar to the X-directional wirings 802. An interlayer insulating layer (not shown) is provided between the (m) X-directional wirings 802 and the (n) Y-directional wirings 803, thereby electrically isolating them. both of m and n are positive integers.

The interlayer insulating layer (not shown) is made of $SiO_2$ or the like formed by using the vacuum evaporation depositing method, printing method, sputtering method, or the like. For example, the interlayer insulating layer (not shown) is formed in a desired shape on the whole surface or a part of the substrate 801 on which the X-directional wirings 802 have been formed. A film thickness, a material, and a fabricating process of the interlayer insulating layer are properly set so that it can endure, particularly, a potential difference in a crossing portion of the X-directional wiring 802 and the Y-directional wiring 803. Each of the X-directional wirings 802 and the Y-directional wirings 803 is led out as an external terminal.

As materials constructing the X-directional wirings 802, the Y-directional wirings 803, and a pair of electrodes (the cathode electrode 2 and the gate electrode 4), a part or all of their component elements may be the same or different. If the material constructing the electrodes and the material of the wirings are the same, the wirings connected to the device electrodes can be also regarded as device electrodes. The device electrodes can be also used as wiring electrodes.

Scanning signal applying means (not shown) for applying scanning signals for selecting a row of the electron emitting devices 804 arranged in the X direction is connected to the X-directional wirings 802. Modulation signal generating means (not shown) for modulating each column of the electron emitting devices 804 arranged in the Y direction in accordance with the input signal is connected to the Y-directional wirings 803. A driving voltage which is applied to each electron emitting device is supplied as a differential voltage between the scanning signal and the modulation signal which are applied to each device.

Figure 10:
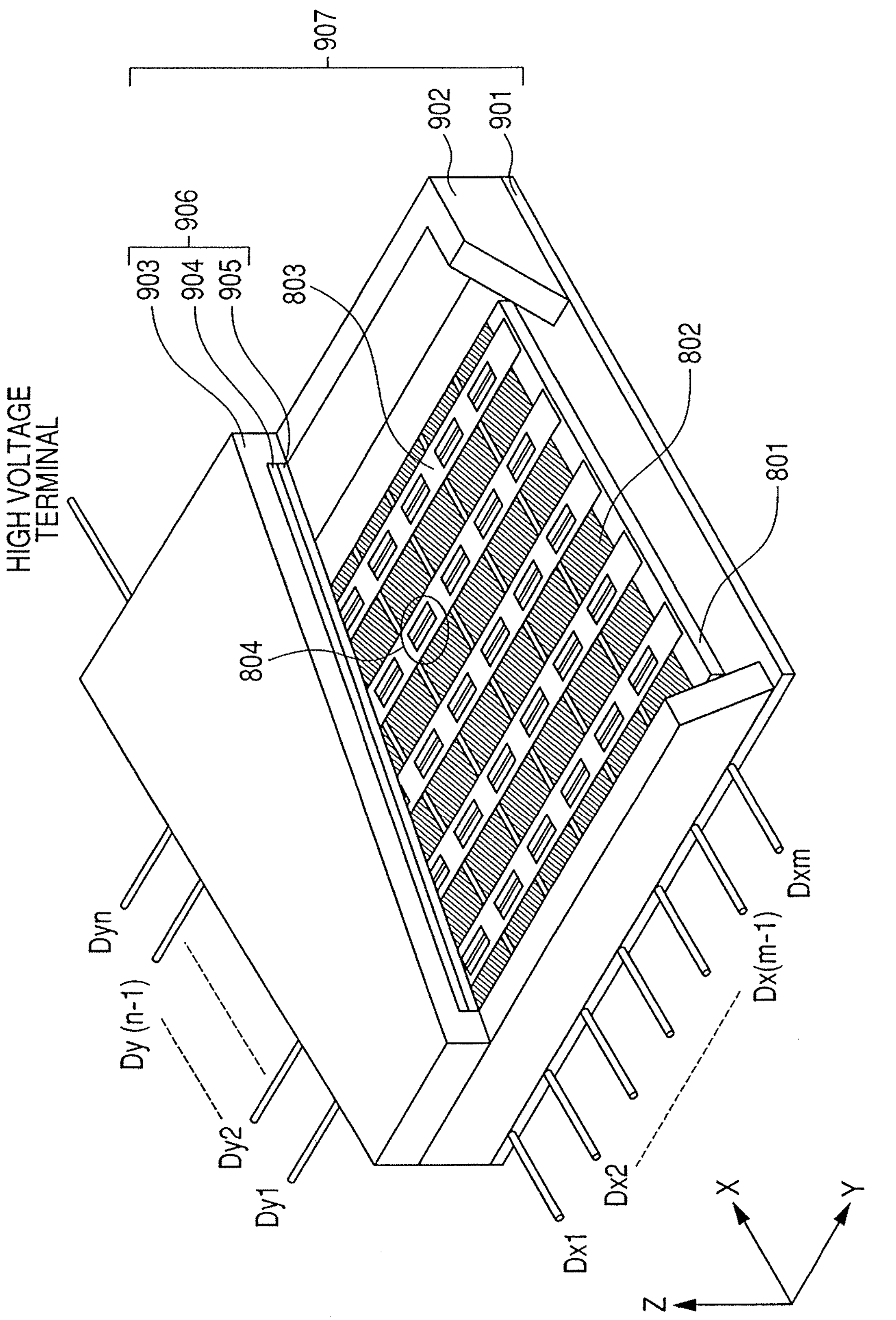
FIG. 10 is a schematic constructional diagram showing an image display device using the electron source of the matrix arrangement obtained by the process of the invention.

In the above construction, the individual electron emitting devices can be selected and independently driven by using simple matrix wirings. An image display device constructed by using the electron source of such a simple matrix arrangement will be described with reference to FIG. 10. FIG. 10 is a schematic constructional diagram showing an example of a display panel of the image display device.

In FIG. 10, reference numeral 801 denotes the electron source substrate on which a plurality of electron emitting devices have been arranged; 901 a rear plate to which the electron source substrate 801 has been fixed; 906 a face plate in which a phosphor film 904 as a light-emitting member, a metal back 905, and the like have been formed on the inner surface of a glass substrate 903; and 902 a supporting frame. The rear plate 901 and the face plate 906 are connected to the supporting frame 902 by using frit glass or the like. Reference numeral 907 denotes an envelope. The envelope 907 is formed by a method whereby, for example, it is baked in the atmosphere or nitrogen at a temperature range of 400 to 500° C. for 10 minutes or longer and sealed and bonded.

The envelope 907 is constructed by the face plate 906, supporting frame 902, and rear plate 901 as mentioned above. Since the rear plate 901 is provided mainly for the purpose of reinforcing the strength of the substrate 801, if the substrate 801 itself has a sufficient strength, the rear plate 901 as a separate member can be made unnecessary. That is, the supporting frame 902 may be directly sealed and bonded to the substrate 801 and the envelope 907 may be constructed by the face plate 906, supporting frame 902, and substrate 801. By arranging a supporting member (not shown) called a spacer between the face plate 906 and the rear plate 901, the envelope 907 having a sufficient strength against the atmospheric pressure can be also constructed.

In the image display device using the electron emitting device of the invention, the light-emitting member (phosphor film 904) is aligned and arranged over the electron emitting devices 804 in consideration of a trajectory of the emitted electrons.

Figure 11A:
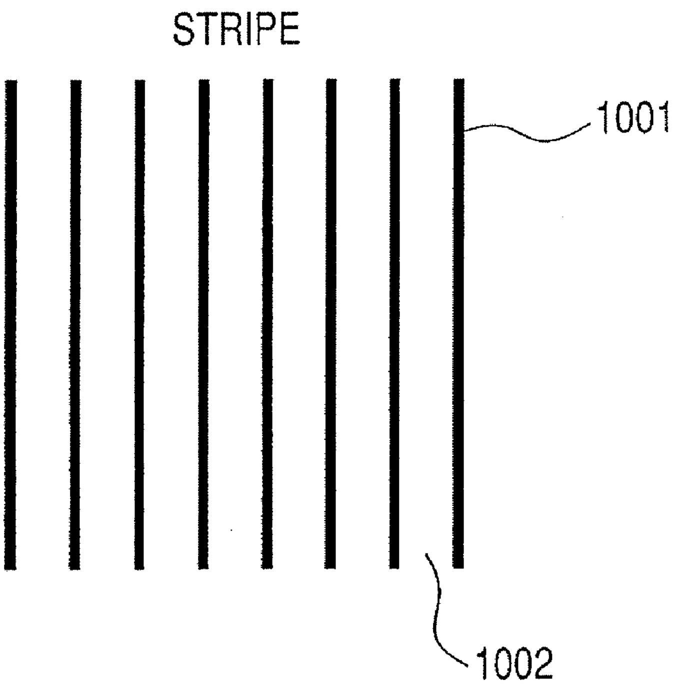
FIGS. 11A and 11B are explanatory diagrams of a phosphor film in an image forming apparatus according to the invention.
Figure 11B:
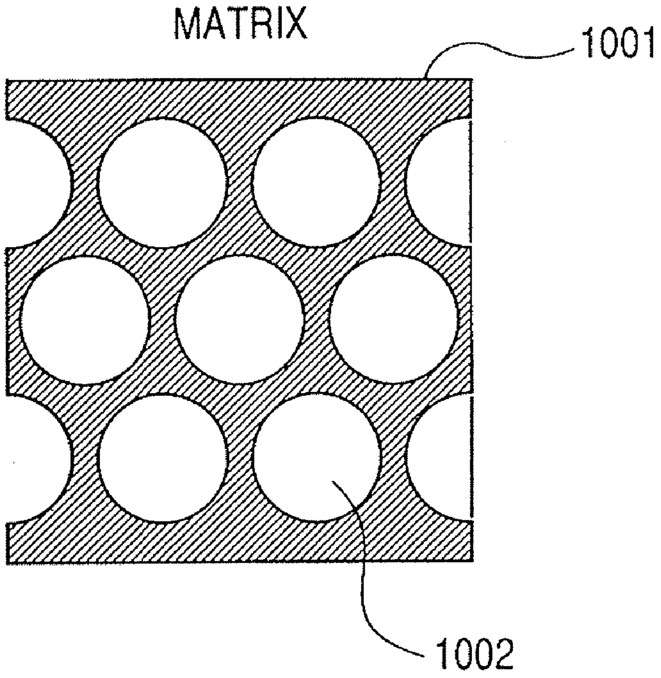

FIGS. 11A and 11B are schematic diagrams showing the phosphor film 904 used in the panel of the invention. In the case of a color phosphor film, it is constructed by: a black member 1001 called a black stripe shown in FIG. 11A, a black matrix shown in FIG. 11B, or the like in dependence on an arrangement of phosphor; and phosphor 1002.

The image display device of the invention can be also used as a display device of a television conference system, a display device of television broadcasting, a computer, etc., or the like.

EMBODIMENT

Embodiments of the invention will be described in detail hereinbelow.

Embodiment 1

The process for fabricating the electron emitting device of the embodiment will be described in detail with reference to FIGS. 1A to 1D and 2A to 2D.

[Step 1-1: FIG. 1A]

First, a quartz is used as a substrate 1. After the substrate 1 was sufficiently cleaned, an Al film having a thickness of 300 nm is formed as a cathode electrode material 2 onto the substrate 1.

Subsequently, to form the insulating layer 3, an $SiO_2$ film having a thickness of about 1000 nm is formed by a plasma CVD method using $SiH_4$ or $NO_2$ as a raw material gas.

Subsequently, a Ta film having a thickness of 100 nm is formed as a gate electrode 4 onto the insulating layer 3 by the sputtering method.

[Step 1-2: FIG. 1B]

Subsequently, by the photolithography, spin coating of a positive type photoresist is executed, a photomask pattern is exposed and developed, and the mask pattern 12 is formed. A diameter of the first hole 6 at this time is set to 3 μm. The second hole 7 which is juxtaposed with the first hole 6 is also simultaneously formed. A diameter of the second hole 7 in this instance is set to 2 μm. A thickness of insulating layer 3 sandwiched between the first hole 6 and the second hole 7 is set to 1 μm.

[Step 1-3: FIG. 1C]

Subsequently, the dry etching is performed under the conditions in which mixture gases of $CF_4$ and $H_2$ are used as an etching gas, an etching power is set to 150 W, and an etching pressure is set to 5 Pa, and the etching is stopped on the upper surface of the cathode electrode 2.

[Step 1-4: FIG. 1D]

Subsequently, the remaining mask pattern 12 is removed by a peeling liquid.

[Step 1-5: FIG. 2A]

Subsequently, by the photolithography, the spin coating of the positive type photoresist is executed, the photomask pattern is exposed and developed, and the mask pattern 13 in which the first hole 6 is exposed is formed.

[Step 1-6: FIG. 2B]

Subsequently, a diamond-like carbon film having a thickness of about 30 nm is deposited by using the plasma CVD method, thereby forming the electron emitting film 5.

[Step 1-7: FIG. 2C]

Subsequently, the mask pattern 13 is lifted off by the peeling liquid.

[Step 1-8: FIG. 2D]

Subsequently, the $SiO_2$ film is wet-etched by dipping it into a BHF (etching rate: 100 nm/min) for 11 minutes and cleaned with the water, thereby completing the electron emitting device of the embodiment.

Embodiment 2

The electron emitting device is completed through steps 2-1 to 2-6.

Since steps 2-1 to 2-4 are similar to steps 1-1 to 1-4 in the embodiment 1, subsequent steps 2-5 and 2-6 will be explained.

[Step 2-5]

After a photosensitive polymer was patterned near the first hole 6 in FIG. 2C, by executing a heat treatment at 500° C. in the vacuum, the polymer is carbonized, thereby obtaining the electron emitting film 5.

[Step 2-6]

Subsequently, the $SiO_2$ film is wet-etched by dipping it into the BHF (etching rate: 100 nm/min) for 11 minutes and cleaned with the water for 10 minutes, thereby completing the electron emitting device of the embodiment.

Embodiment 3

The electron emitting device is completed through steps 3-1 to 3-6.

Since steps 3-1 to 3-4 are similar to steps 1-1 to 1-4 in the embodiment 1, subsequent steps 3-5 and 3-6 will be explained.

[Step 3-5]

A viscosity of the photosensitive polymer and a rotational speed of the spin coating are adjusted and the first hole 6 and the second hole 7 are coated with the photosensitive polymer under the conditions that although the photosensitive polymer is inserted into the first hole 6 having the large hole portion, the photosensitive polymer is not inserted into the second hole 7 which has the small hole portion and is juxtaposed with the first hole. According to the conditions in this instance, the viscosity of the photosensitive polymer is set to 20 cp and the rotational speed of the spin coating is set to 3000 rpm. After that, by executing a heat treatment at 550° C. in the vacuum, the polymer is carbonized, thereby obtaining the electron emitting film 5 having a thickness of tens of nm (refer to FIG. 7A)

[Step 3-6]

Subsequently, the $SiO_2$ film is wet-etched by dipping it into the BHF (etching rate: 100 nm/min) for one minute while applying an ultrasonic wave and, thereafter, by dipping it into the BHF (etching rate: 100 nm/min) for about 10 minute and cleaned with the water, thereby completing the electron emitting device of the embodiment. At this time, since there is no supporting member on the lower side of the electron emitting film 5 covered on the juxtaposed second hole 7, the electron emitting film 5 is perfectly removed (refer to FIG. 7B).

Embodiment 4

The process for fabricating the electron emitting device of the embodiment will be described in detail with reference to FIGS. 1A to 1D, 2A to 2D, 6A, and 6B.

[Step 4-1: FIG. 6A]

First, a quartz is used as a substrate 1. After the substrate 1 was sufficiently cleaned, a Pt film having a thickness of 300 nm is formed as a cathode electrode material 2 onto the substrate 1 by the sputtering method.

Subsequently, to form the insulating layer 3, an $SiO_2$ film having a thickness of about 500 nm is formed by the plasma CVD method using $SiH_4$ or $NO_2$ as a raw material gas.

Subsequently, an $SiN_x$ film having a thickness of about 500 nm is formed by using the plasma CVD method using $SiH_4$, $NH_4$, or $N_2$ as a raw material gas in order to form the insulating layer 3'.

Subsequently, a Ta film having a thickness of 100 nm is formed as a gate electrode 4 onto the insulating layer 3' by resistance heating evaporation deposition.

[Step 4-2]

Subsequently, by the photolithography, the spin coating of the positive type photoresist is executed, the photomask pattern is exposed and developed, and the mask pattern 12 is formed as shown in FIG. 1B. A diameter of the first hole 6 at this time is set to 3 μm. The second hole 7 which is juxtaposed with the first hole 6 is also simultaneously formed. A diameter of the second hole 7 is set to 2 μm. A thickness of insulating layer 3 sandwiched between the first hole 6 and the second hole 7 is set to 1 μm.

[Step 4-3]

Subsequently, the dry etching is performed under the conditions in which the mixture gases of $CF_4$ and $H_2$ are used as an etching gas, the etching power is set to 150 W, and the etching pressure is set to 5 Pa, and the etching is stopped on the upper surface of the cathode electrode 2, thereby setting a state similar to that of FIG. 1C.

[Step 4-4]

Subsequently, the remaining mask pattern 12 is removed by the peeling liquid, thereby setting a state similar to that of FIG. 1D.

[Step 4-5]

Subsequently, by the photolithography, the spin coating of the positive type photoresist is executed, the photomask pattern is exposed and developed, and the mask pattern 13 in which the first hole 6 is exposed is formed.

[Step 4-6]

Subsequently, the diamond-like carbon film having a thickness of about 30 nm is deposited by using the plasma CVD method, thereby forming the electron emitting film 5 in a manner similar to FIG. 2B.

[Step 4-7]

Subsequently, the mask pattern 13 is lifted off by the peeling liquid, thereby setting a state similar to that of FIG. 2C.

[Step 4-8: FIG. 6B]

Subsequently, the $SiO_2$ film is wet-etched by dipping it into the BHF (etching rate of $SiO_2$: 100 nm/min) for 11 minutes and cleaned with the water for 10 minutes, thereby completing the electron emitting device of the embodiment.

Embodiment 5

The electron emitting device is completed through steps 5-1 to 5-7.

Since steps 5-1 to 5-4 are similar to steps 1-1 to 1-4 in the embodiment 1, subsequent steps 5-5 to 5-7 will be explained.

[Step 5-1]

A Co film having a thickness of 10 nm is formed by using the sputtering method.

[Step 5-6]

Subsequently, the $SiO_2$ film is wet-etched by dipping it into the BHF (etching rate: 100 nm/min) for 11 minutes and cleaned with the water for 10 minutes, thereby obtaining the state where the Co film has been deposited in place of the electron emitting film 5 of FIG. 2D.

[Step 5-7]

Subsequently, by heating the Co film at 600° C. in $C_2H_4$ of the atmospheric pressure, fibrous carbon is grown from Co so as to have a height of 100 nm or less and used as an electron emitting film 5 in FIG. 2D, thereby completing the device. The growing conditions of fibrous carbon are not limited to those conditions.

Embodiment 6

Processing steps are similar to those in the embodiment 3 except for the following points. The second hole 7 is formed into an annular flat shape as shown in FIG. 4A. The electron emitting device of FIG. 4B having the electron emitting film 5 in the center portion of the portion where the first hole 6 and the second hole 7 are integrated is formed.

Embodiment 7

The electron emitting device formed by the embodiment is connected as shown in FIG. 8. By applying the voltages Vb and Va in order to drive the electron emitting device, a strong electric field is formed in the formed hole. A shape of an equipotential surface in the hole is determined on the basis of Vb, the thickness and shape of the insulating layer 3, a dielectric constant of the insulating layer, and the like. In a region out of the hole, an almost parallel equipotential surface is obtained due to Va although it mainly depends on a distance H between the electron emitting film 5 and the anode electrode 8.

When an electric field which is applied to the electron emitting film 5 exceeds a predetermined threshold value, an electron is emitted from the electron emitting film 5. The electron emitted from the hole collides with phosphor (not shown) provided for the anode electrode 8 and light is emitted.

The anode electrode 8 is arranged over the electron emitting device fabricated in the embodiment 1 and a voltage is applied between the cathode electrode 2 and the gate electrode 4, thereby driving the device.

The applied voltage Va=10 kV and the distance H between the electron emitting film 5 and the anode electrode 8 is set to 2 mm.

The electrode coated with phosphor is used as an anode electrode 8 and a size of electron beam is observed. The electron beam size mentioned here denotes a size to a region in which peak luminance of light-emitted phosphor is equal to 10%. A diameter of electron beam is equal to 80 μm/80 μm(x/y).

Similar devices are fabricated ten times and a variation of the beam diameter is observed, so that a variation width lies within ±2%.

Embodiment 8

The image display device is fabricated by using the electron emitting devices fabricated by the embodiment 3. The (100×100) electron emitting devices shown in the embodiment 3 are arranged in a matrix shape. The X-side wirings are connected to the cathode electrode 2 and the Y-side wirings are connected to the gate electrode 4. The devices are arranged at a pitch of 300 μm in the lateral direction and 300 μm in the vertical direction. Phosphor is arranged over the devices. Thus, the image display device of high luminance and high precision which can be matrix-driven could be formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-255835, filed Sep. 5, 2005, which is hereby incorporated by reference herein in its entirety.

What is claimed is:

1. A process for fabricating an electron emitting device, comprising the steps:

(A) providing a structure which comprises a first conductive layer, an insulating layer disposed on said first conductive layer and a second conductive layer disposed on said insulating layer wherein a first hole penetrates to said first conductive layer through said insulating layer and said second conductive layer;

(B) depositing a layer of material for an electron emitting member, onto the inner surface of said first hole;

(C) forming a second hole which penetrates through at least said second conductive layer amongst said insulating layer and said second conductive layer, the second hole being juxtaposed with said first hole; and (D) etching a part of said insulating layer interposed between said juxtaposed first and second holes until said first and second holes are communicated with each other, wherein said step (D) is conducted after step (B) and step (C).

2. The process according to claim 1, wherein said layer of material from which the electron emitting member is formed is deposited by a spraying process.

3. The process according to claim 1, wherein the etching in the step (D) is a wet etching.

4. A process of producing an electron source provided with a plurality of electron emitting devices, wherein each of the electron emitting devices is fabricated by the process according to claim 1.

5. A process of assembling an image display device provided with an electron source and a light-emitting member which emits light when being irradiated by electrons emitted from said electron source, wherein said electron source is produced by the process according to claim 4.

6. A process for fabricating an electron emitting device, comprising the steps:

(A) providing a structure which comprises a first conductive layer, an insulating layer disposed on said first conductive layer and a second conductive layer disposed on said insulating layer, wherein a first hole penetrates to the first conductive layer through said insulating layer and said second conductive layer and a second hole juxtaposed with said first hole penetrates through at least said insulating layer, and a layer of material for an electron emitting member is deposited on the inner surface of said first hole; and (B) etching a part of said insulating layer interposed between said juxtaposed first and second holes, until said layer of electron emitting member material deposited on the inner sidewall of said first hole collapses so that the juxtaposed first and second holes are communicated with each other, wherein said step (B) is conducted after step (A).

7. A process of fabricating an image display device provided with a plurality of electron emitting devices, each being fabricated by the process according to claim 6.

* * * * *